United States Patent
Huang

[19]

[11] Patent Number: 5,964,285
[45] Date of Patent: Oct. 12, 1999

[54] HEAT SINK

[75] Inventor: Yao-Lee Huang, Taipei Hsien, Taiwan

[73] Assignee: Yung-Tsai Chu, Chungli City, Taiwan

[21] Appl. No.: 09/249,144

[22] Filed: Feb. 12, 1999

[51] Int. Cl.$^6$ .................................................. F28F 7/00
[52] U.S. Cl. ................. 165/185; 165/80.3; 257/722; 361/703; 361/702; 361/710
[58] Field of Search .................. 165/185, 80.3, 165/104.33; 361/690, 702, 703, 710; 257/722

[56] References Cited

U.S. PATENT DOCUMENTS

| | | | |
|---|---|---|---|
| 2,473,634 | 6/1949 | Brown, Jr. ............................. | 165/185 |
| 4,009,752 | 3/1977 | Wilson ................................. | 165/185 X |
| 4,689,720 | 8/1987 | Daszkowski ......................... | 165/185 X |
| 5,791,406 | 8/1998 | Gönner et al. ...................... | 165/185 X |

FOREIGN PATENT DOCUMENTS

| | | | |
|---|---|---|---|
| 2688374 | 9/1993 | France .................................. | 165/185 |
| 0257157 | 12/1975 | Japan .................................... | 165/185 |
| 0042154 | 3/1982 | Japan .................................... | 165/104.33 |

*Primary Examiner*—Christopher Atkinson
*Attorney, Agent, or Firm*—Varndell Legal Group

[57] ABSTRACT

A heat sink for use in a computer for dissipating heat which includes a flat base plate having elongated coupling grooves and upright cylindircal sockets in the coupling grooves, a plurality of U-shaped radiating fins respectively mounted in the elongated coupling grooves at the flat base plate, and a slotted holding down plate covered on the flat base plate and secured to the upright cylindrical sockets at the flat base plate to hold down the radiating fins.

1 Claim, 5 Drawing Sheets

HEAT SINK

BACKGROUND AND SUMMARY OF THE INVENTION

The present invention relates to a heat sink for use in a computer for dissipating heat, and more particularly to such a heat sink which is inexpensive to manufacture and, which provides extended air contact area for quick dissipation of heat.

A regular computer heat sink, as shown in FIG. 1, is extruded from aluminum, having a plurality of radiating fins. Because the heat sink is extruded from aluminum, the height of the radiating fins is limited, and the thickness of the radiating fins can not be reduced to the desired level. Because the radiating fins have a certain thickness, much aluminum material is used, and the manufacturing cost of the heat sink is high. FIG. 2 shows another structure of heat sink according to the prior art. This structure of heat sink comprises a flat base plate, and a plurality of radiating fins having respective mounting flanges respectively bounded to the flat base plate. Because the radiating fins are fastened to the flat base plate by bounding, a long drying procedure is needed. Therefore, the fabrication speed is slow. Further, because the radiating fins are bounded to the flat base plate by labor, it is difficult to control the bounding quality. FIG. 3 shows still another structure of heat sink according to the prior art. This structure of heat sink comprises a flat base plate, and a plurality of single layer radiating fins formed integral with the top side wall of the flat base plate. Because the heat sink is made by die casting, the bottom side wall of the flat base plate is uneven, and must be processed again after die cating. This die casting manufacturing method can not achieve a satisfactory productivity. Furthermore, the fraction defective of die casting is high.

The present invention has been accomplished to provide a heat sink which eliminates the aforesaid drawbacks. It is one object of the present invention to provide a heat sink which is easy and inexpensive to manufacture. It is another object of the present invention to provide a heat sink which achieves satisfactory heat dissipation performance. To achieve these and other objects of the present invention, a heat sink is provided comprises of a flat base having elongated coupling grooves and upright cylindrical sockets in the coupling grooves, a plurality of U-shaped radiating fins respectively mounted in the elongated coupling grooves at the flat base plate, and a holding down plate covered on the flat base plate to hold down the radiating fins. The holding down plate has insertion slots through which side walls of the U-shaped radiating fins pass, and through holes respectively fastened to the upright cylindrical sockets at the flat base plate by rivets.

DETAILED DESCRIPTION OF THE PREFERRED EMBODIMENT

Figure 1:
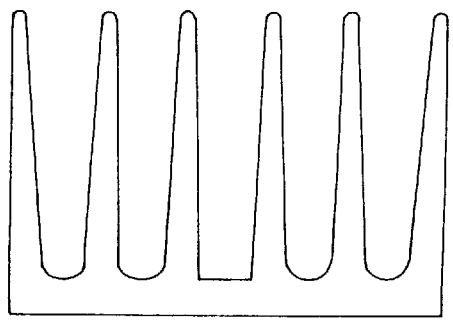
FIG. 1 shows a heat sink according to the prior art.
Figure 2:
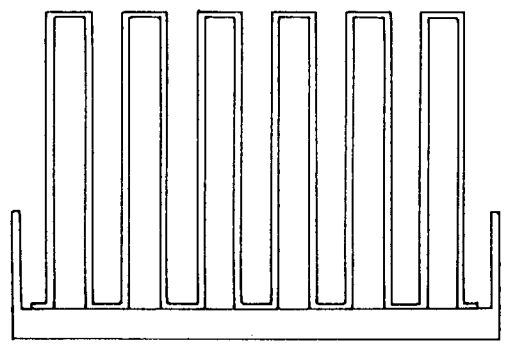
FIG. 2 shows another structure of heat sink according to the prior art.
Figure 3:
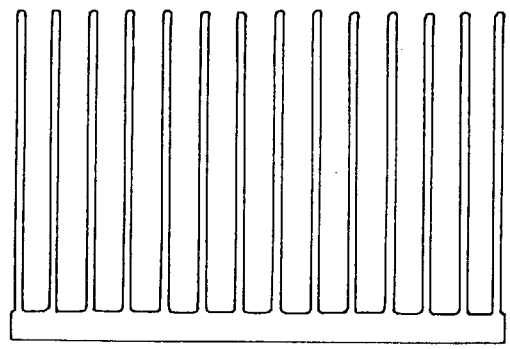
FIG. 3 shows still another structure of heat sink according to the prior art.
Figure 4:
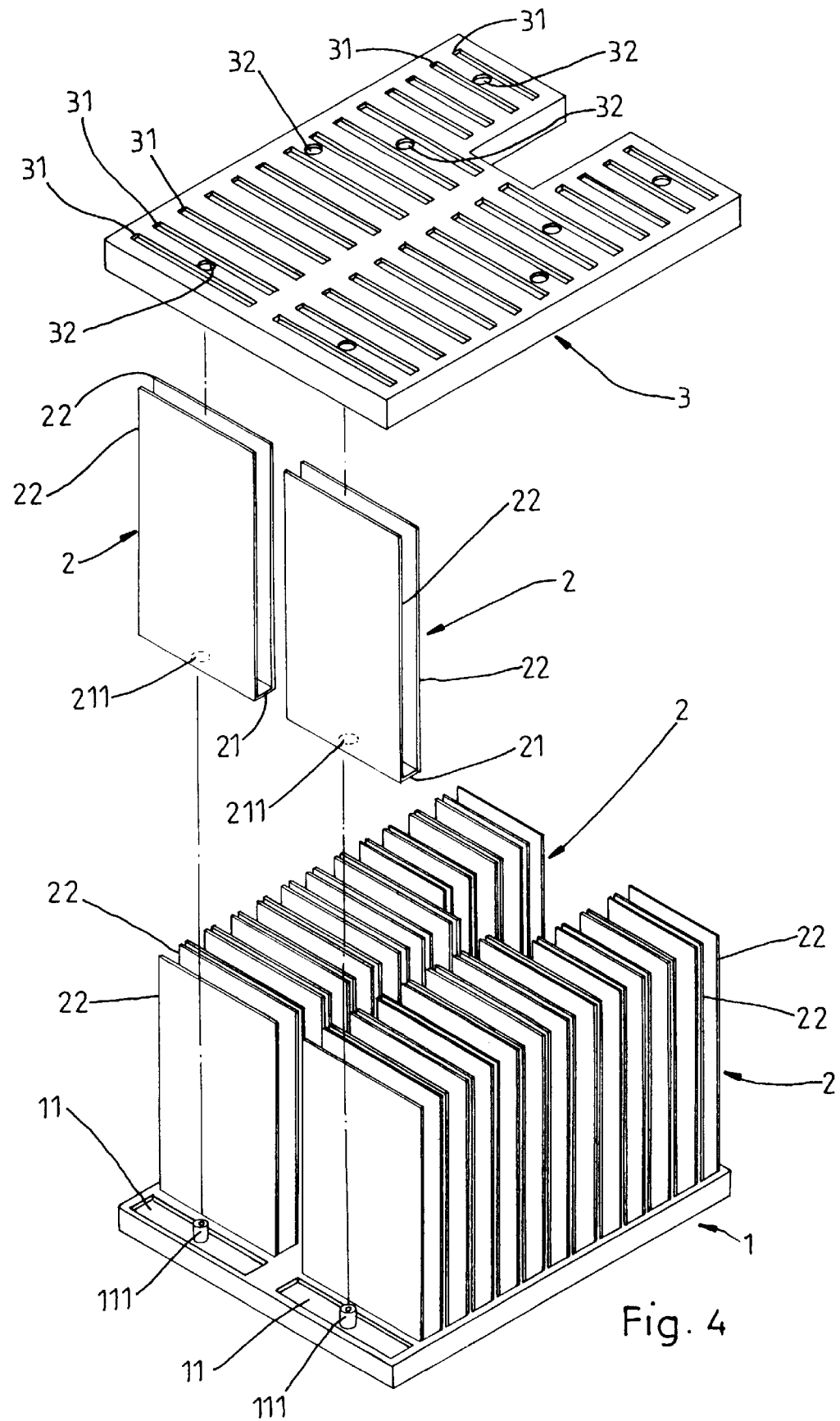
FIG. 4 is an exploded view of a heat sink according to the present invention.
Figure 5:
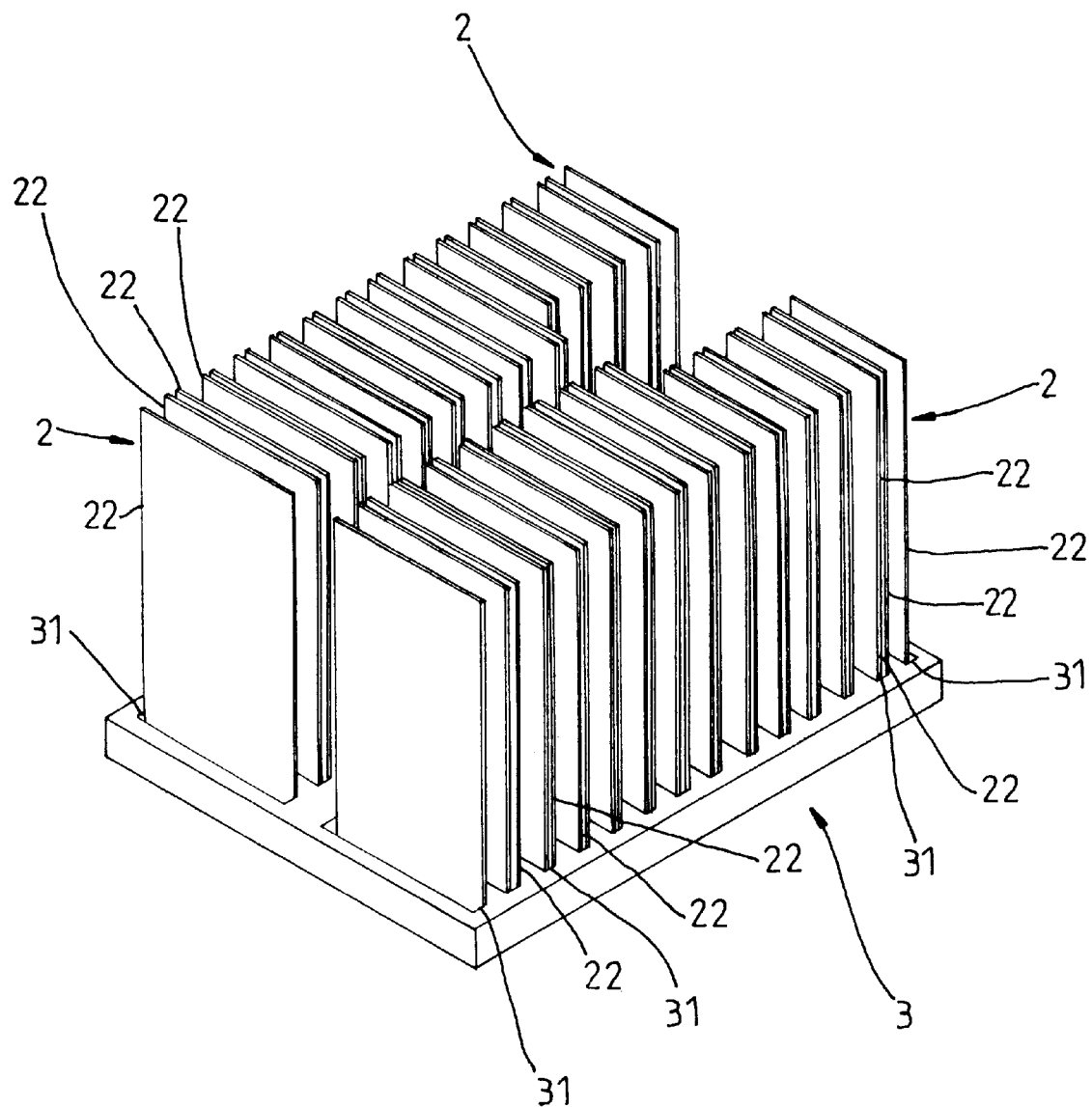
FIG. 5 is a perspective assembly view of the heat sink according to the present invention.
Figure 6:
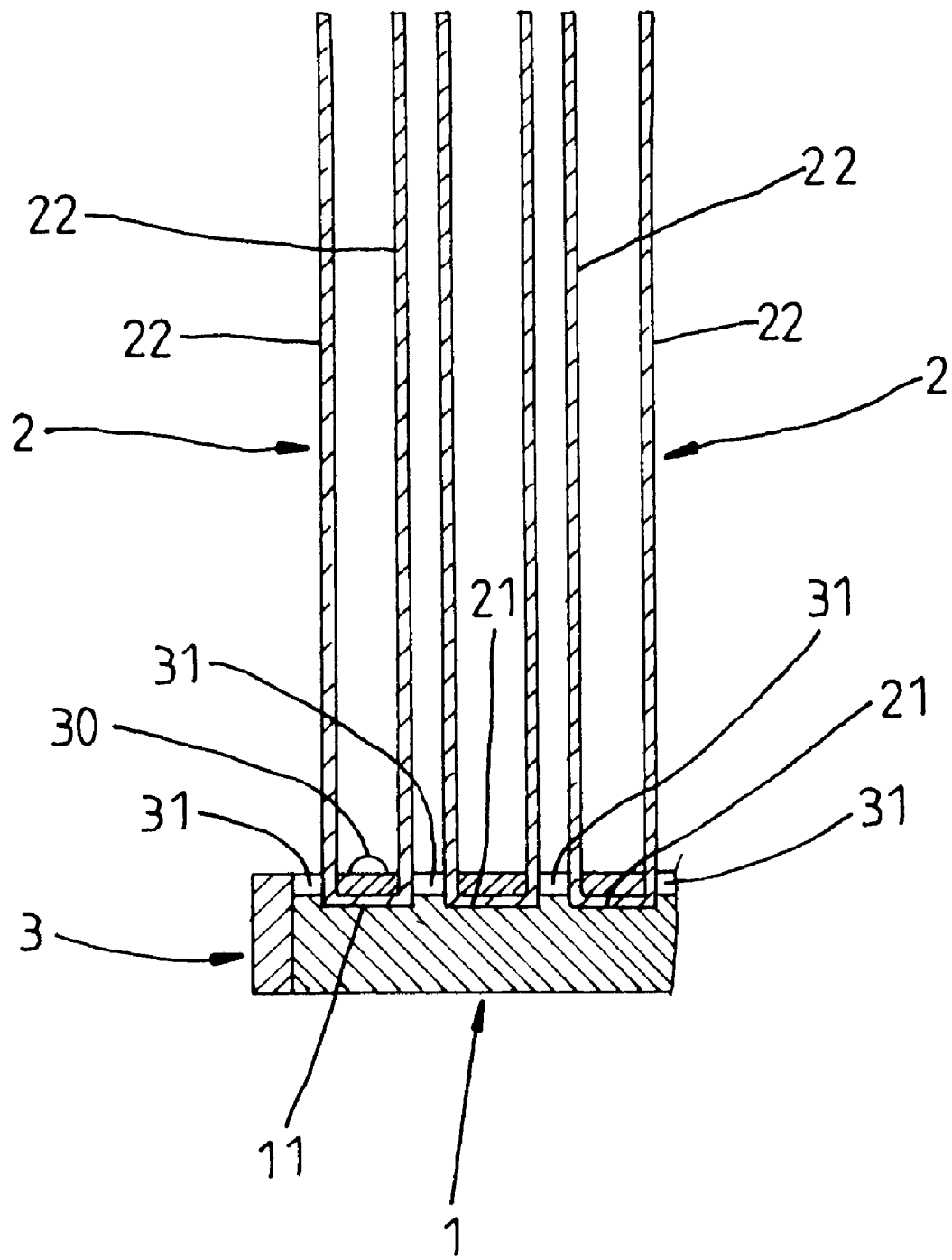
FIG. 6 is a cross sectional view in an enlarged scale of a part of FIG. 5.
Figure 7:
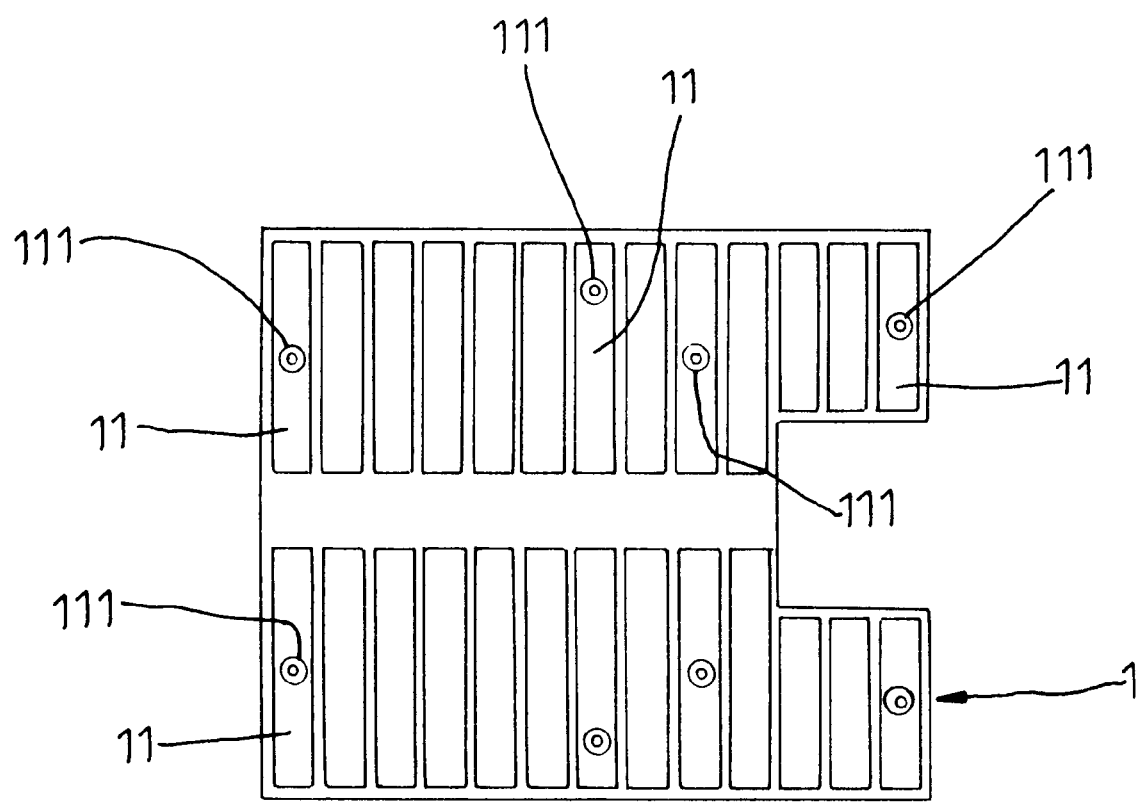
FIG. 7 is a top plain view of the flat base plate for the heat sink according to the present invention.

Referring to FIGS. from 4 through 7, a heat sink in accordance with the present invention is generally comprised of a base plate 1, a plurality of radiating fins 2, and a holding down plate 3.

The base plate 1 is a flat plate comprising a plurality of elongated coupling grooves 11 arranged at its top side wall, and a plurality of upright cylindrical sockets 111 respectively raised from its top side wall in the elongated coupling grooves 11.

The radiating fins 2 are respectively made by bending a metal sheet into a substantially U-shaped profile, each comprising an elongated horizontal bottom wall 21, which fits each elongated coupling groove 11 at the base plate 1, two vertical side walls 22 perpendicularly raised from two opposite long sides of the elongated horizontal bottom wall 21 and arranged in parallel, and a through hole 211 at the center of the elongated horizontal bottom wall 21.

The holding down plate 3 is covered on the base plate 1 to hold down the radiating fins 2, having a plurality of insertion slots 31 through which the side walls 22 of the rediating fins 2 pass respectively, and a plurlity of through holes 32 through which the upright cylindircal sockets 111 pass.

The radiating fins 2 are fastened to the base plate 1 by forcing the elongated horizontal bottom walls 21 of the radiating fins 2 into the elongated coupling grooves 11 at the base plate 1, permitting the upright cylindrical sockets 111 to be inserted through the through holes 211 at the elongated horizontal bottom walls 21 of the radiating fins 2 respectively. After installation of the radiating fins 2 in the base plate 1, the holding down plate 3 is covered on the base plate 1, permitting the side walls 22 of the radiating fins 2 and the upright cylindrical sockets 111 of the base plate 1 to be respectively inserted through the insertion slots 31 and the through holes 32 at the holding down plate 3, and then rivets 30 are respectively fastened to the upright cylindrical sockets 111 to securely fix the holding down plate 3 to the base plate 1.

When assembled, the radiating fins 2 are firmly retained in close contact with the base plate 1 for quick dissipation of heat. Because the radiating fins 2 each have a through hole 211 at its elongated horizontal bottom wall 21, they can quickly positioned in the coupling grooves 11 at the base plate 1. The design of the present invention allows the height of the radiating fins 2 to be greatly increased as desired, and the pitch between raidating fins 2 can be greatly reduced, so as to increase the surface contact area of the heat sink.

I claim:

1. A heat sink comprising:

a flat base plate, said flat base plate comprising a plurality of elongated coupling grooves arranged at a top side wall thereof, and a plurality of upright cylindrical sockets respectively raised from the top side wall in said elongated coupling grooves;

a plurality of radiating fins respectively fastened to the elongated coupling grooves at said flat base plate, said radiating fins each comprising an elongated horizontal bottom wall respectively press-fitted into the elongated coupling grooves at said flat base plate, two vertical side walls perpendicularly raised from two opposite long sides of said elongated horizontal bottom wall and arranged in parallel, and at least one through hole at said elongated horizontal bottom wall through which said upright cylindrical sockets pass; and a holding down plate covered on said flat base plate to hold down said radiating fins, said holding down plate comprising a plurality of insertion slots through which the side walls of said radiating fins pass respectively, and a plurality of through holes respectively fastened to the upright cylindrical sockets at said flat base plate by a respective rivet.

\* \* \* \* \*